US006215147B1

(12) United States Patent
Hong

(10) Patent No.: US 6,215,147 B1
(45) Date of Patent: Apr. 10, 2001

(54) FLASH MEMORY STRUCTURE

(75) Inventor: Gary Hong, Hsin-Chu (TW)

(73) Assignee: United Microelectronics, Corp., Hsinchu (TW)

( * ) Notice: Subject to any disclaimer, the term of this patent is extended or adjusted under 35 U.S.C. 154(b) by 0 days.

(21) Appl. No.: 09/235,261

(22) Filed: Jan. 22, 1999

(30) Foreign Application Priority Data

Aug. 12, 1998 (TW) .................................. 87113258

(51) Int. Cl.$^7$ .................................. H01L 29/788
(52) U.S. Cl. ..................... 257/315; 257/314; 257/315; 257/316
(58) Field of Search ................... 257/314, 315, 257/316

(56) References Cited

U.S. PATENT DOCUMENTS

| | | | | |
|---|---|---|---|---|
| 5,071,782 | * | 12/1991 | Mori | 437/48 |
| 5,282,160 | * | 1/1994 | Yamagata | 365/185 |
| 5,568,418 | * | 10/1996 | Crisenza et al. | 365/185.01 |
| 5,570,314 | * | 10/1996 | Gill | 365/185.1 |
| 5,892,257 | * | 4/1999 | Acocella et al. | 257/316 |
| 5,929,480 | * | 7/1999 | Hisanume | 257/320 |
| 5,932,909 | * | 8/1999 | Kato et al. | 257/315 |
| 5,998,827 | * | 12/1999 | Park | 257/315 |
| 6,028,336 | * | 2/2000 | Yuan | 257/315 |
| 6,037,221 | * | 3/2000 | Lee et al. | 438/257 |

FOREIGN PATENT DOCUMENTS

| | | | | |
|---|---|---|---|---|
| 000573169 | * | 6/1994 | (EP) | 257/315 |
| 406163921 | * | 6/1994 | (JP) | 257/315 |

* cited by examiner

Primary Examiner—Eddie C. Lee
Assistant Examiner—Edgardo Ortiz
(74) Attorney, Agent, or Firm—Jiawei Huang; J. C. Patents

(57) ABSTRACT

A flash memory structure and a method of fabricating the same are provided. The flash memory structure is formed with buried bit lines that are lower in resistance, are shallower in buried depth into the substrate, and have a larger punchthrough margin than the prior art. The flash memory structure is constructed on a semiconductor substrate. A tunneling oxide layer is formed over the substrate. A plurality of floating gates is formed at predefined locations over the tunneling oxide layer. A plurality of sidewall spacers is formed on the sidewalls of the floating gates. A plurality of selective polysilicon blocks is formed over the substrate, each being formed between one neighboring pair of the floating gates. An ion-implantation process is performed to dope an impurity element through these selective polysilicon blocks into the substrate to thereby form a plurality of impurity-doped regions in the substrate to serve as a plurality of buried bit line for the flash memory device. A plurality of insulating layers is formed respectively over the selective polysilicon blocks. A dielectric layer is formed to cover all of the floating gates and the insulating layers, and finally, a plurality of control gates are formed over the dielectric layer, each being located above one of the floating gates.

19 Claims, 3 Drawing Sheets

FLASH MEMORY STRUCTURE

CROSS-REFERENCE TO RELATED APPLICATION

This application claims the priority benefit of Taiwan application serial no. 87113258, filed Aug. 12, 1998, the full disclosure of which is incorporated herein by reference.

BACKGROUND OF THE INVENTION

1. Field of the Invention:

This invention relates to semiconductor fabrication technology, and more particularly, to a flash memory structure with buried bit lines and a method of fabricating the same.

2. Description of Related Art:

Flash memory is a type of erasable and programmable read-only memory (EPROM) that can be easily and quickly reprogrammed. In a flash memory device, each memory cell is formed with a two-layer gate structure (called stacked gate) including a floating gate and a control gate. The floating gate is typically formed from polysilicon and is so named because it is not physically connected to any other conductive structures in the integrated circuit. Whether or not data is stored on a memory cell is dependent on whether or not the floating gate of the memory cell is charged. The control gate is formed over the floating gate and connected to a word line to control the access to the memory cell.

FIG. 1 is a schematic diagram showing the circuit layout of an array of flash memory cells (one of which is enclosed in a dashed circle indicated by the reference numeral 10). These flash memory cells can be accessed via a plurality of word lines WL1, WL2 and a plurality of bit lines BL1, BL2, BL3 that are interconnected in a predetermined manner to the flash memory device. The access operation for each flash memory cell (i.e., read/write operation) is performed through a phenomenon called Fowler-Nordheim tunneling (F-N tunneling) between the floating gates and the associated impurity-doped regions. The access speed is dependent on the mobility of electrons between the floating gates and the impurity-doped regions. The access operation is basic knowledge to those skilled in the art of semiconductor memory devices, so description thereof will not be further detailed.

It is a trend in semiconductor industry to fabricate integrated circuits with high integration. To meet this requirement, the present layout design for the flash memory should be miniaturized in size. However, the achievable level of miniaturization is limited by the present design rule. The fabrication of buried bit lines in a miniaturized, conventional flash memory device would be complex and thus difficult to carry out.

SUMMARY OF THE INVENTION

It is therefore an objective of the present invention to provide a flash memory structure with buried bit lines that are lower in resistance and shallower in buried depth in the substrate than the prior art due to the forming of shallow $N^+$ junctions.

It is another objective of the present invention to provide a flash memory structure with buried bit lines that are formed with a shallow $N^+$ junction having a smaller contact area with the substrate so that the punchthrough margin can be increased to allow enhanced reliability to the flash memory device.

In accordance with the foregoing and other objectives of the present invention, an improved flash memory structure and a method of fabricating the same are provided.

The flash memory structure includes a semiconductor substrate; a tunneling oxide layer formed over the substrate; a plurality of floating gates formed at predefined locations over the tunneling oxide layer; a plurality of sidewall spacers, each formed on the sidewall of one of the floating gates; a plurality of selective polysilicon blocks, each formed between one neighboring pair of the floating gates; a plurality of impurity-doped regions in the substrate, each formed beneath one of the selective polysilicon blocks to serve as a plurality of buried bit line for the flash memory device; a plurality of insulating layers, each formed over one of the selective polysilicon blocks; a dielectric layer covering all of the floating gates and the insulating layers; and a plurality of control gates formed over the dielectric layer, each located above one of the floating gates.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In accordance with the invention, the buried bit lines of the flash memory device are formed by performing an ion-implantation process to dope an impurity element through a plurality of selective polysilicon blocks into the substrate. With the provision of the selective polysilicon blocks, the depth of the penetration of the impurity ions into the substrate can be reduced, thus forming a shallow $N^+$ junction with a reduced contact area with the substrate. This feature allows a reduced punchthrough margin so that the reliability of the resultant flash memory device can be enhanced.

FIGS. 2A–2G are schematic sectional diagrams used to depict the steps involved in the method of the invention for fabricating such a flash memory device.

Figure 1:
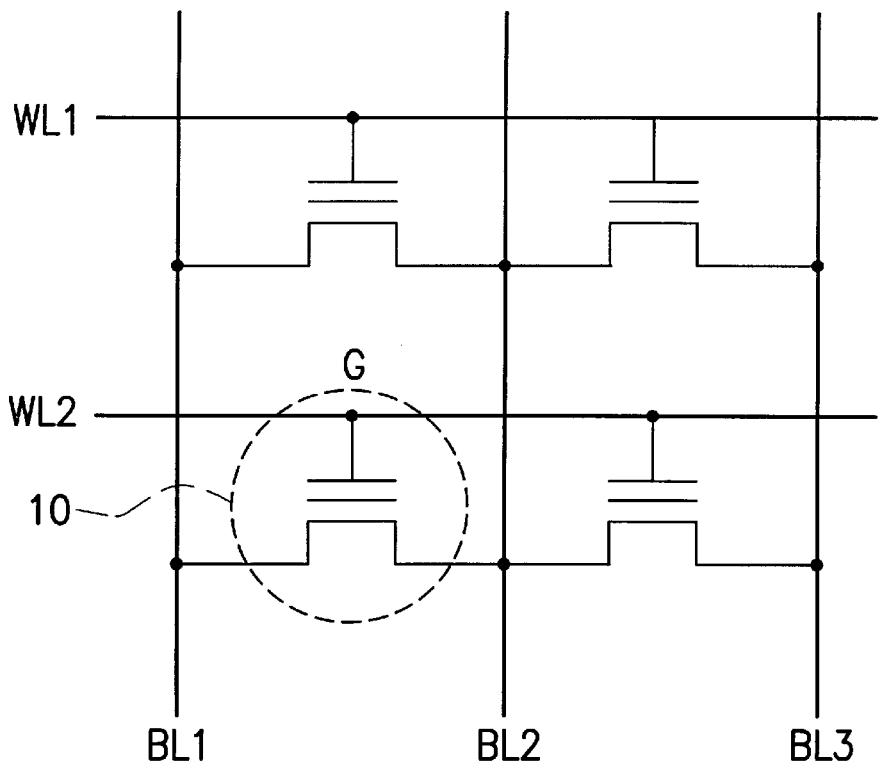
FIG. 1 is a schematic diagram showing the circuit layout of an array of memory cells of a flash memory device.
Figure 2A:
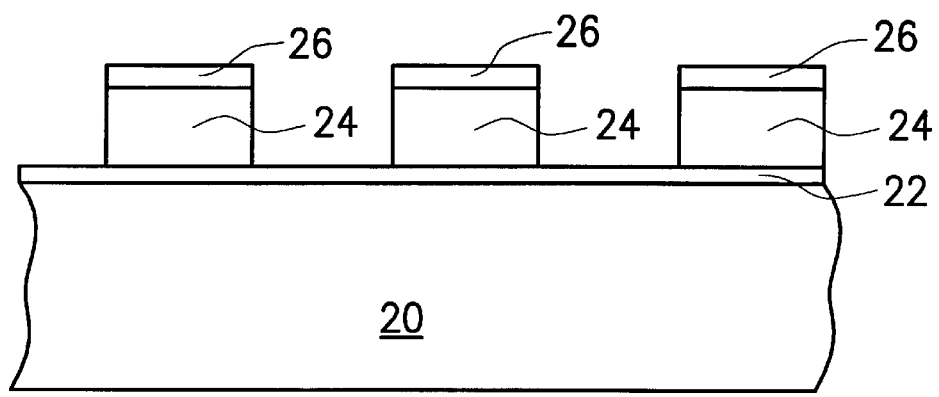
FIGS. 2A–2G are schematic sectional diagrams used to depict the steps involved in the method of the invention for fabricating a flash memory device.

Referring first to FIG. 2A, in the first step, a semiconductor substrate 20 is pre15 pared. In this substrate 20, a plurality of isolation structures (not shown) such as field oxide layers or shallow-trench isolation (STI) structures are formed to define a plurality of active regions over the substrate 20. These isolation structures are not within the spirit and scope of the invention, so they are not illustrated in the drawings. A tunneling oxide layer 22 is formed over the substrate 20, preferably through a thermal oxidation process, to a thickness of from 50 Å to 100 Å (angstrom). Next, a plurality of floating gates 24 are formed at predefined locations over the tunneling oxide layer 22; and further, a plurality of insulating layers 26 are formed respectively over the floating gates 24. The floating gates 24 and the overlying insulating layer 26 can be formed by, for example, first forming a first conductive layer, such as a polysilicon layer, through a chemical-vapor deposition (CVD) process to a thickness of from 500 Å to 2,000 Å. An impurity element is then doped into the polysilicon layer to increase the conductivity thereof, and then silicon nitride is deposited over the doped polysilicon layer through a CVD process to a thickness of from 200 Å to 2,000 Å. Finally, a photolithographic and etching process is performed to etch away selected portions of the silicon nitride layer and the underlying doped polysilicon layer until the top surface of the tunneling oxide layer 22 is exposed. The remaining portions of the doped polysilicon layer serve as the above-mentioned floating gates 24 and the remaining portions of the silicon nitride layer serve as the above-mentioned insulating layers 26.

Figure 2B:
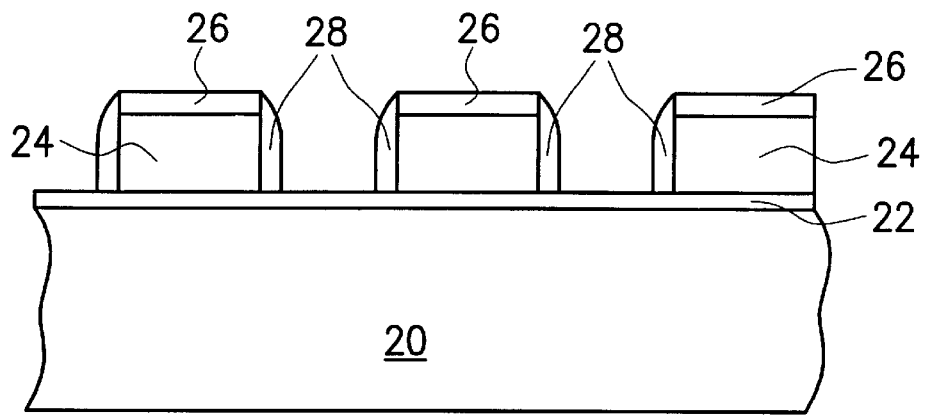

Referring next to FIG. 2B, in the subsequent step, sidewall spacers 28 are formed, each being formed on the sidewall of the stacked structure of one floating gate 24 and the overlying insulating layer 26. These sidewall spacers 28 can be formed by, for example, first forming an oxide layer to a thickness of from 100 Å to 1,000 Å to cover all the stacked structures of the floating gates 24 and the insulating layers 26, and then performing an anisotropic etch-back process on the oxide layer with the tunneling oxide layer 22 serving as etch end point. The remaining portions of the oxide layer then serve as the above-mentioned sidewall spacers 28.

Figure 2C:
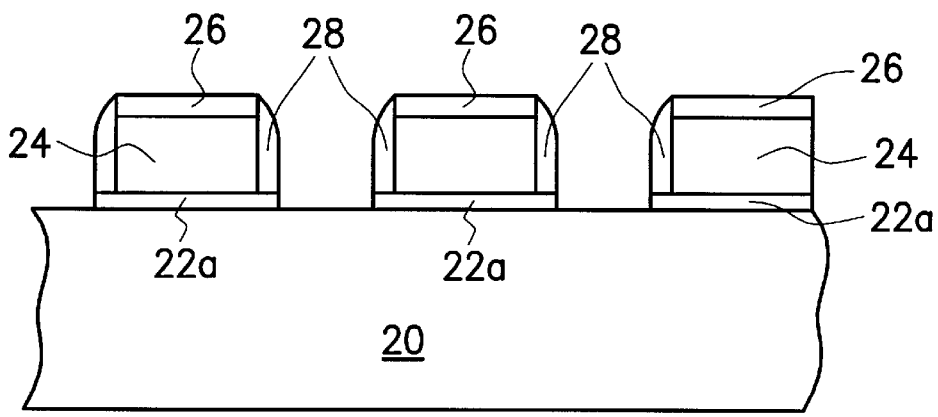

Referring further to FIG. 2C, in the subsequent step, with the sidewall spacers 28 serving as mask, an etching process, such as a wet-etching process or a dry-etching process, is performed to etch away the exposed portions of the tunneling oxide layer 22 until the top surface of the substrate 20 is exposed.

Figure 2D:
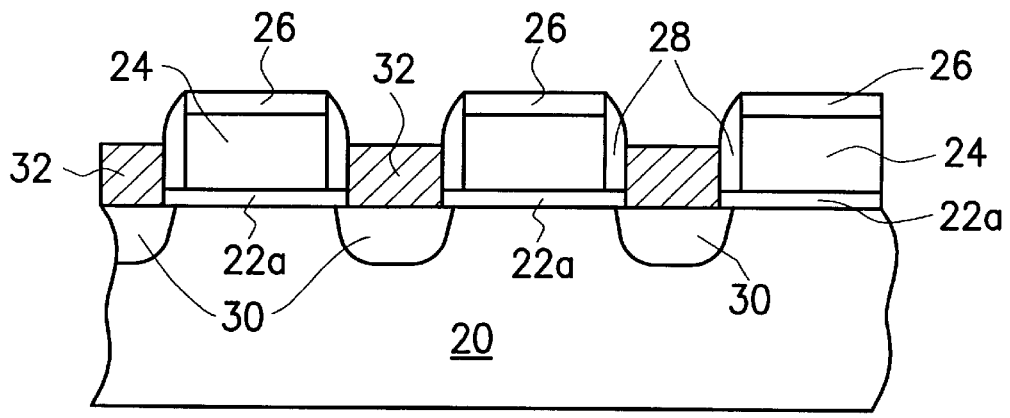

Referring next to FIG. 2D, in the subsequent step, a selective polysilicon deposition process is performed to form a plurality of selective polysilicon blocks 32 between the floating gates 24. These selective polysilicon blocks 32 can be formed by, for example, first forming a doped polysilicon layer to a thickness above the insulating layer 26, and then performing an etch-back process on the doped polysilicon layer until the remaining doped polysilicon reaches a predefined height lower than the topmost surfaces of the insulating layers 26. The remaining portions of the doped polysilicon then serve as the above-mentioned selective polysilicon blocks 32.

In the case of the substrate 20 being an epitaxial layer, the selective polysilicon blocks 32 are alternatively formed by first forming a seed layer of amorphous silicon (not shown) over the substrate 20 before the tunneling oxide layer 22 is formed, then performing a thermal process at temperature of about 1,000° C. for nucleation of the seed layer (not shown). The nucleated seed layer then serves as the above-mentioned selective polysilicon blocks 32.

After the selective polysilicon blocks 32 are formed, the subsequent step is to perform an ion-implantation process with the floating gates 24 and the sidewall spacers 28 serving as mask, so as to dope an N-type impurity element in ion form, such as ionized arsenic (As) or phosphor (P), with a concentration of from $10^{15}$ atoms/cm$^2$ through the selective polysilicon blocks 32 into those portions of the substrate 20 that are laid directly beneath the selective polysilicon blocks 32. Through this process, a plurality of N-type impurity-doped regions 30 are formed beneath the selective polysilicon blocks 32. Optionally, a thermal process can be performed to cause the impurity ions in the impurity-doped regions 30 to diffuse evenly in the impurity-doped regions 30. These N-type impurity-doped regions 30 are used to serve as a plurality of buried bit lines for the flash memory. It is a characteristic feature of the invention that these buried bit lines can be formed with a shallower depth into the substrate 20 as compared to the prior art.

Figure 2E:
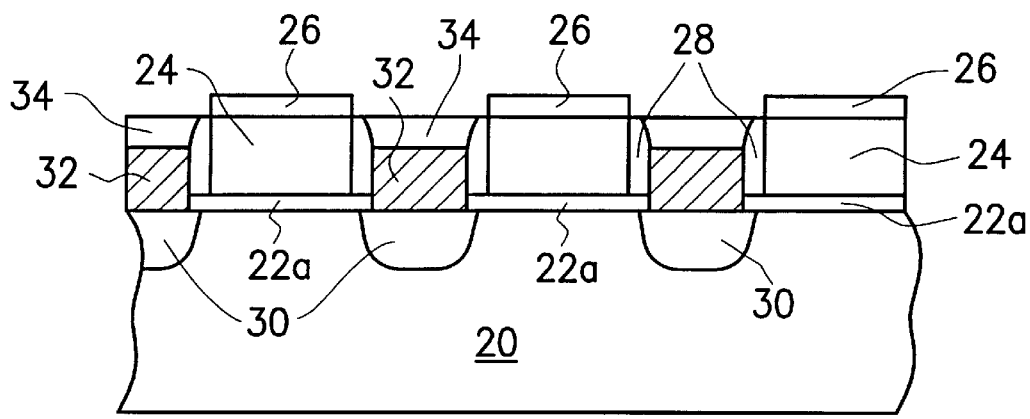

Referring next to FIG. 2E, in the subsequent step, insulating layers 34 are formed respectively over the selective polysilicon blocks 32. These insulating layers 34 can be formed by, for example, first performing a CVD process to form a layer of silicon dioxide to a thickness above the insulating layer 26, and then performing a removal process on the silicon dioxide layer until the remaining portions thereof are substantially leveled to the topmost surface of the floating gates 24. The removal process can be, for example, an etch-back process, or an anisotropic plasma-etch process, or a chemical-mechanical polish (CMP) process.

Figure 2F:
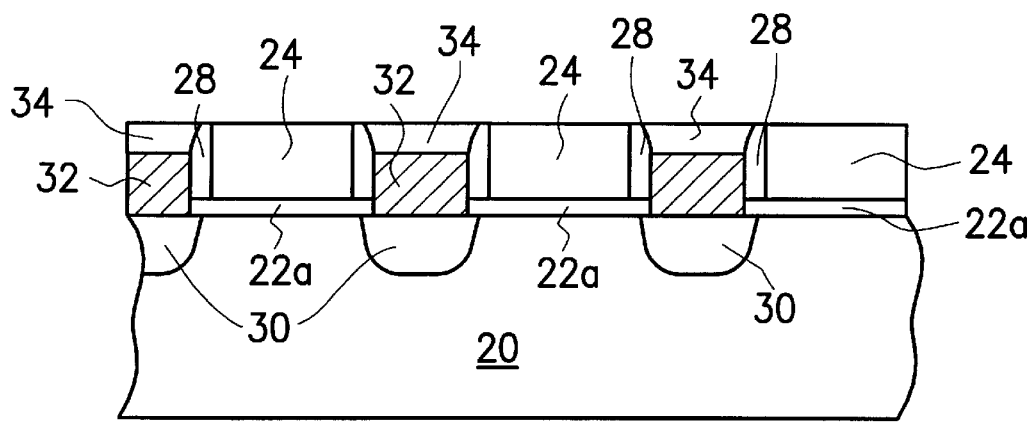

Referring further to FIG. 2F, in the subsequent step, all the insulating layers 26 above the floating gates 24 are removed to expose the underlying floating gates 24. The insulating layer 26 can be removed through, for example, an etch-back process or a CMP process.

Figure 2G:
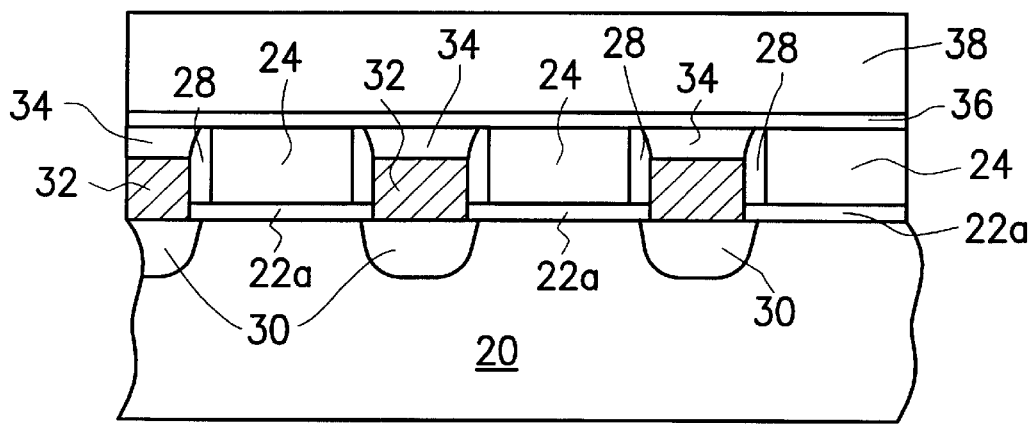

Referring next to FIG. 2G, in the subsequent step, a dielectric layer 36 is formed over the entire top surface of the wafer, covering all the exposed surfaces of the floating gates 24 and the insulating layers 34. The dielectric layer 36 is preferably an ONO (silicon oxide/silicon nitride/silicon oxide) structure. Next, a second conductive layer 38 is formed over the dielectric layer 36 by, for example, first performing a CVD process to form a polysilicon layer, and then doping an impurity element into the polysilicon layer to increase the conductivity thereof. The second conductive layer 38 is then selectively removed in such a manner as to allow the remaining portions thereof to be laid directly above the floating gates 24 to serve as control gates for the floating gates 24.

In conclusion, the invention has the following advantages over the prior art.

(1) First, the invention allows the buried bit lines (i.e., the N-type impurity-doped regions 30) to be formed with a smaller resistance and a shallower depth into the substrate than the prior art due to the implantation of the impurity ions through the selective polysilicon blocks 32.

(2) Second, the invention allows the buried bit lines (i.e., the N-type impurity-doped regions 30) to be formed with a higher punchthrough margin than the prior art since the N-type impurity-doped regions 30 are formed with a shallow N$^+$ junction having a small contact area with the substrate 20. The resultant reliability of the resultant flash memory cell can thus be enhanced.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A flash memory device, which comprises:

a semiconductor substrate;

a tunneling oxide layer formed over the substrate;

a plurality of floating gates formed at predefined locations over the tunneling oxide layer;

a plurality of sidewall spacers, each being formed on the sidewall of one of the floating gates, wherein a portion of the substrate between the sidewall spacers is still exposed;

a plurality of selective polysilicon blocks on the exposed portion of the substrate, each being formed between one neighboring pair of the floating gates, and the selective polysilicon blocks having a top surface lower than a top surface of the floating gates;

a plurality of impurity-doped regions in the substrate, each being formed beneath one of the selective polysilicon blocks to serve as a plurality of buried bit line for the flash memory device;

a plurality of insulating layers, each being formed on one of the selective polysilicon blocks and between the sidewall spacers;

a dielectric layer covering all of the floating gates and the insulating layers; and a plurality of control gates formed over the dielectric layer, each being located above the floating gates.

2. The device of claim 1, wherein the tunneling oxide layer has a thickness of from 50 Å to 100 Å.

3. The device of claim 1, wherein the floating gates are formed from doped polysilicon.

4. The device of claim 1, wherein each floating gate has a thickness of from 500 Å to 2,000 Å.

5. The device of claim 1, wherein the buried bit lines are each a shallow $N^+$ junction.

6. The device of claim 1, wherein the insulating layers are each a layer of silicon dioxide.

7. The device of claim 1, wherein the dielectric layer is an ONO structure.

8. The device of claim 1, wherein the control gates are formed from doped polysilicon.

9. A semiconductor device, which comprises:

a semiconductor substrate;

an oxide layer formed over the substrate;

a plurality of floating gates formed at predefined locations over the oxide layer;

a plurality of sidewall spacers, each being formed on the sidewall of one of the floating gates, wherein a portion of the substrate between the sidewall spacers is still exposed;

a plurality of selective polysilicon blocks on the exposed portion of the substrate, each being formed between one neighboring pair of the floating gates, and the selective polysilicon blocks having a top surface lower than a top surface of the floating gates;

a plurality of impurity-doped regions in the substrate, each being formed beneath one of the selective polysilicon blocks to serve as a plurality of buried bit line for the semiconductor device; and a plurality of insulating layers, each being formed over one of the selective polysilicon blocks.

10. The device of claim 9, further comprising:

a dielectric layer covering all of the floating gates and the insulating layers; and a plurality of control gates formed over the dielectric layer, each being located above one of the floating gates.

11. The device of claim 10, wherein the dielectric layer is an ONO structure.

12. The device of claim 10, wherein the control gates are formed from doped polysilicon.

13. The device of claim 9, wherein the oxide layer has a thickness of from 50 Å to 100 Å.

14. The device of claim 9, wherein the floating gates are formed from doped polysilicon.

15. The device of claim 9, wherein each floating gates has a thickness of from 500 Å to 2,000 Å.

16. The device of claim 9, wherein the buried bit lines are each a shallow $N^+$ junction.

17. The device of claim 9, wherein the insulating layers are each a layer of silicon dioxide.

18. The device of claim 1, wherein the dielectric layer is a planar layer.

19. The device of claim 10, wherein the dielectric layer is a planar layer.

* * * * *